United States Patent Office 3,311,510

Patented Mar. 28, 1967

3,311,510
METHOD OF MAKING A SILICON SEMICONDUCTOR DEVICE

Joseph Mandelkorn, Cleveland Heights, Ohio, assignor to the United States of America as represented by the Administrator of the National Aeronautics and Space Administration No Drawing. Filed Mar. 16, 1964, Ser. No. 352,400
4 Claims. (Cl. 148—1.5)

The invention described herein may be manufactured and used by or for the Government of the United States of America for governmental purposes without the payment of any royalties thereon or therefor.

The present invention relates to a semiconductor material having improved properties and greater resistance to radiation damage. More particularly, the invention is concerned with an improved silicon material for semiconductor devices having a small quantity of a rare earth element or compound in the silicon.

The power output of a silicon solar cell exhibits considerable degradation when it is subjected to high energy atomic particle bombardment, and this affect is detrimental to the useful life of space vehicles which utilize such semiconductor devices as sources of power. This radiation damage results from an undesirable loss in the lifetime of minority carriers within the silicon material from which the solar cells are made.

It has been ascertained that minority carrier lifetime in bombarded silicon is affected by the impurities which have been added to obtain the desired resistivity of the material. More particularly, for a particular bombardment dose the value of minority carrier lifetime in silicon material containing a small added quantity of the rare earth element gadolinium is higher than that in silicon containing certain other impurities added to reduce the resistivity of the material to equivalent values.

It is, therefore, an object of the present invention to provide a "P" type material having improved characteristics for making semiconductor devices.

Another object of the invention is to provide an improved silicon solar cell material containing controlled amounts of rare earth elements which result in slower degradation of the power output of the cell when subjected to high energy particle bombardment.

A further object of the invention is to provide a silicon material containing a small quantity of gadolinium to improve the properties and radiation damage resistance of the material.

Other objects and advantages of the invention will be apparent from the specification which follows.

Certain electrically active impurities are normally added in controlled quantities to materials, such as silicon, that are to be used in semiconductor devices in order to lower the resistivity to a desired value. The electrical properties of the silicon are altered in this manner because such impurities ionize in the silicon and each ionized impurity atom contributes one mobile charge, called a majority carrier, to the material.

Other mobile charges, called minority carriers, result from the breaking of covalent bonds between silicon atoms. The operation of many semiconductor devices, such as transistors, diodes and solar cells, depends upon the currents arising from the movement of these minority carriers. Therefore, the mobility and lifetime of minority carriers in semiconductor materials are extremely significant in determining device performance. However, the presence of the large quantities of majority carriers in silicon required to reduce the resistivity of the material to a desirable value decreases the mobility and lifetime of the minority carriers in the material. A further decrease in the lifetime of minority carriers occurs when the material is bombarded with high energy atomic particles, such as 1 m.e.v. electrons or 10 m.e.v. protons.

The theory for the limited lifetime of minority carriers, of the order of microseconds, in semiconductor material postulates the existence of configurations of atoms within the material which act to attract and combine minority and majority carriers, which are always of opposite electrical sign. Such configurations are referred to as recombination centers, and these centers expedite the neutralization of minority carriers thereby decreasing the lifetime of the minority carriers.

The increase in resistivity of material which occurs when the material is bombarded is attributed to configurations of atoms in the material called trapping centers which attract and then immobilize majority carriers for a period of time. This effectively increases the resistivity because, at any given moment, a quantity of majority carriers are immobilized. The quantity of immobilized carriers at any instant depends upon the density of the trapping centers. The mechanisms whereby bombardment increases the density of recombination centers thereby decreasing minority carrier lifetime, and increases the density of trapping centers thereby increasing resistivity were previously presumed to be attributable to vacancies created in the lattice by bombardment which form recombination or trapping center configurations.

It was also previously believed that the concentration of the electrically active impurities in the semiconductor material was related to the lifetime of minority carriers only because each impurity atom contributed a majority carrier, and the greater the number of majority carriers, the greater the probability of a minority carrier combining with a majority carrier. The relationship between concentrations of these impurity atoms and minority carrier lifetime is based on considerations of the statistical probability of a minority carrier recombining with a majority carrier through the media of a fixed density of recombination centers.

The present invention is based on the discovery that the atoms of various electrical active impurity elements themselves affect the formation of recombination centers in the semiconductor material. It has also been discovered that certain of these impurity elements are more desirable than others because the presence of atoms of the desirable impurity results in the formation of either less recombination centers or less trapping centers than the presence of atoms of other electrically active impurity elements in equal concentration.

According to the present invention, small amounts of a rare earth element or compound are added to a semiconductor material to reduce its resistivity and preserve good material properties. By way of example, gadolinium is added to silicon, and solar cells made from this material are superior to those made from silicon doped with an equal concentration of boron. Boron is an electrically active impurity which has been added to silicon in the past to reduce the resistivity.

To illustrate the beneficial technical effect of the present invention, groups of solar cells were fabricated from several impurity-doped silicon ingots, each having an impurity concentration sufficient to produce a resistivity in the ten to twenty ohm-centimeter range. The first group of cells was fabricated from an ingot of boron-doped silicon grown from a melt in a quartz crucible, and these cells are identified as C–B in the Table 1 below.

A second group of cells was similarly fabricated from a gadolinium-doped ingot, and the cells made from this ingot are identified as C–Gd. The gadolinium can be added to silicon by direct addition of pure gadolinium to silicon in a crucible or by zone melting the pure gadolinium into the silicon. The addition of this element can also be accomplished by adding gadolinium compounds in the manner described or by the preparation of a master alloy of silicon and gadolinium which is added to the silicon.

Both groups of cells were subjected simultaneously to a series of 1-m.e.v. electron bombardments as illustrated in Table 1. The diffusion length (L) was measured for each cell after each bombardment, and the curve power factor (CPF) was measured for each cell after the last bombardment. Table 1 presents average characteristics of the two groups of cells after these bombardments. Because the cells within each group had uniform characteristics after bombardment, valid differentiation in terms of average diffusion length preserved was possible.

TABLE 1

| Cell Group | Number of Samples | Dose (e/sq. cm.) | | | |
|---|---|---|---|---|---|
| | | $1.2\times10^{15}$ L (microns) | $1.5\times10^{16}$ L | $4.1\times10^{16}$ | |
| | | | | L | CPF, percent |
| C–B | 2 | 36 | 13 | 10 | 65 |
| C–Gd | 2 | 44 | 16.5 | 12 | 55 |

The diffusion length (L) in Table 1 is defined by the equation $L=\sqrt{D\times\tau}$, where D is the diffusion constant and $\tau$ is the minority carrier lifetime. Therefore, the diffusion length is directly proportional to the minority carrier lifetime, and a longer diffusion length after bombardment indicates a larger preserved value of minority carrier lifetime in the material.

The curve power factor (CPF) is defined as the ratio, expressed in percent, of the maximum power output of the cell to the product of its open-circuit voltage and short-circuit current. It is evident from Table 1 that the curve power factor of the C–Gd group is the most adversely affected by the bombardment while the C–B is the least affected. This indicates that gadolinium in silicon acts to increase the majority carrier removal rate. It can also be seen in Table 1 that the C–Gd group preserves longer diffusion lengths under bombardment than the C–B group. This shows that gadolinium acts to preserve longer minority carrier lifetimes under bombardment.

It is evident from Table 1 that the properties of gadolinium are superior to the properties of boron insofar as the influence of such properties on the formation of recombination centers is concerned. More particularly, the boron atom is involved in the formation of bombardment introduced recombination centers, and the presence of boron in the silicon lattice in high concentration around the region of the junction creates strains and distortions of the lattice structure and results in the formation of recombination centers in the junction region. The replacement of boron by gadolinium improves junction characteristics as well as radiation damage resistance, and the concentration of gadolinium may be controlled to produce desired resistivities. The improved properties of gadolinium-doped material can be attributed to the atomic structure of the gadolinium atom.

Because the properties of gadolinium are similar to those of other rare earth elements, the addition of other rare earth elements to silicon will also reduce the resistivity of the material and produce improved characteristics. From experiments with other rare earth elements it is found that some of them, such as samarium, ionize more readily in silicon than gadolinium, and only small quantities of these rare earth elements need be used to decrease the resistivity of silicon to the desired values. For example, two grams of gadolinium added to 250 grams of silicon reduced the resistivity of the silicon to 50 ohm-centimeters. However, only 0.05 gram of samarium added to the same quantity of silicon produced the same resistivity. It is further apparent that other rare earth elements will behave in the superior fashion of gadolinium in regard to radiation damage because of the similarity of their atomic structures.

The higher carrier removal damage rate of gadolinium under bombardment is an effect associated with the superiority of this element in diffusion length preservation under bombardment. This effect holds true for a number of other impurities which may be added to silicon. A small number of the impurity atoms associate with lattice defects forming both trapping centers and recombination centers. The atomic structure of the impurity element determines whether an atom of the specific impurity in association with a lattice defect will be most likely to form either a recombination center or a trapping center. In the case where the trapping center configuration is most favored, the impurity element will induce undesirable majority carrier removal radiation damage in the material and will induce correspondingly less diffusion length radiation damage. Gadolinium is an example of this case.

Since lattice defects are also present in unbombarded silicon, the presence of impurity atoms in silicon material will, in general, affect the characteristics of the material and of devices made from the material. In this respect, the addition of gadolinium or other rare earth elements to silicon to reduce its resistivity will result in the material having longer minority carrier lifetime than it would have had if an equal concentration of a less desirable impurity element such as boron had been added to the material.

While several examples of semiconductors having improved radiation damage resistance have been described along with several methods of making these semiconductors, it will be appreciated that various modifications can be made to the disclosed material and method without departing from the spirit of the invention or the scope of the subjoined claims.

What is claimed is:

1. A method of improving the resistance to radiation damage of a silicon semiconductor material comprising the steps of reducing the number of recombination centers and trapping centers by adding an electrically active impurity selected from the rare earth elements to the silicon semiconductor material and increasing the conductivity of the silicon within said semiconductor material by controlling the amount of the addition of said electrically active impurity from the rare earth elements.

2. A method of improving the properties of a semiconductor material as claimed in claim 1 wherein the electrically active impurity is gadolinium.

3. In a method of making a silicon semiconductor device wherein a quantity of an impurity is added to the silicon to lower the resistivity to a predetermined value prior to subjecting the device to high energy atomic particle bombardment, the improvement comprising selecting impurity from the rare earth elements, and adding said rare earth element to the silicon to lower the resistance thereof to a range between 10 to 20 ohm centimeters thereby preserving longer minority carrier lifetimes under bombardment.

4. The method claimed in claim 3 wherein gadolinium is added to the silicon.

References Cited by the Examiner

UNITED STATES PATENTS 2,916,810 12/1959 Smith et al.

3,141,848 7/1964 Enk ------------- 148—1.6 X

HYLAND BIZOT, *Primary Examiner.*